United States Patent

Katayama et al.

[11] Patent Number: 5,850,149
[45] Date of Patent: Dec. 15, 1998

[54] EVALUATION METHOD FOR SEMICONDUCTOR DEVICES

[75] Inventors: Toshiharu Katayama; Naoko Ohtani; Yukari Imai, all of Tokyo, Japan

[73] Assignee: Mitsubishi Denki Kabushiki Kaisha, Tokyo, Japan

[21] Appl. No.: 755,616

[22] Filed: Nov. 25, 1996

[30] Foreign Application Priority Data

May 27, 1996 [JP] Japan ..................... 8-131683

[51] Int. Cl.⁶ .......................... G01R 31/26; H01L 21/66; C23F 1/14
[52] U.S. Cl. ............................ 324/769; 438/14
[58] Field of Search .................... 324/765, 766, 324/769; 438/14

[56] References Cited

U.S. PATENT DOCUMENTS

| | | | |
|---|---|---|---|
| 4,462,856 | 7/1984 | Abe et al. | 156/345 |
| 5,543,334 | 8/1996 | Yoshii et al. | 438/17 |
| 5,670,891 | 9/1997 | Ling et al. | 324/765 |

FOREIGN PATENT DOCUMENTS

| | | |
|---|---|---|
| 0294259A2 | 12/1988 | European Pat. Off. . |
| 0345924A2 | 12/1989 | European Pat. Off. . |
| 4334856A1 | 5/1995 | Germany . |
| 61-137329 | 6/1986 | Japan . |

*Primary Examiner*—Glenn W. Brown
*Attorney, Agent, or Firm*—McDermott, Will & Emery

[57] ABSTRACT

A part of a gate insulation film between a semiconductor substrate and an exposed gate electrode of a semiconductor device is partially and stepwise etched away. A voltage is applied between the semiconductor substrate and the gate electrode in a chemical wet etching system at each step. An anode oxide film is formed on the surface of the gate electrode in a step, when a defect is included in a gate oxide film. The gate electrode is etched away in another step, when a defect is not included in the gate oxide film. A position of a defect in the gate insulation film is detected from the difference in the area of the gate insulation film when an anode oxide film is formed on the gate electrode, and when the gate electrode is etched away.

5 Claims, 12 Drawing Sheets

EVALUATION METHOD FOR SEMICONDUCTOR DEVICES

TECHNICAL FIELD

The present invention relates to an evaluation method for semiconductor devices, and more particularly to an evaluation method for defects in a gate insulation film in semiconductor devices.

BACKGROUND ART

Figure 23:
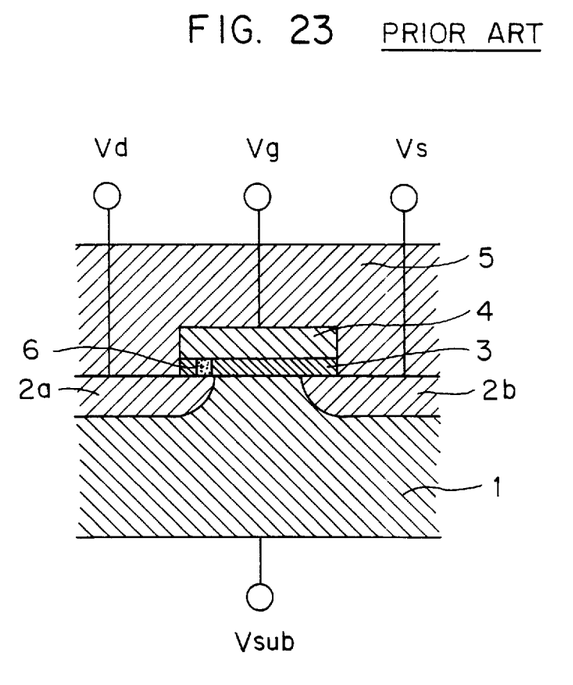
FIG. 23 shows a cross-sectional structure of a MOSFET as an example of a conventional semiconductor device.

First, a conventional evaluation method for semiconductor devices will be explained. As an example of a conventional semiconductor device, FIG. 23 shows a cross-sectional structure of a MOSFET. In FIG. 23, the MOSFET is provided with a p-type Si substrate 1, n+ impurity diffusion layers 2a and 2b, a gate oxide film 3, a gate electrode 4, and an interlayer insulation film 5. Within the gate oxide film 3, there is a structural defect 6, such as a pinhole.

Next, a conventional evaluation method for semiconductor devices will be explained. First, as shown in FIG. 23, a voltage $V_g$ is applied on the gate electrode 4, voltages $V_d$ and $V_s$ respectively on the n+ impurity diffusion layers 2a and 2b, and a voltage $V_{sub}$ on the Si substrate 1. In cases where a structural defect 6 exists within the gate oxide film 3, a leak current will flow by applying a potential difference between voltage $V_g$ and voltage $V_d$, voltage $V_s$, or voltage $V_{sub}$. If no structural defect 6 exists within the gate oxide film 3, then no leak current will flow even if a potential difference is applied between voltage $V_g$ and voltage $V_d$, voltage $V_s$, or voltage $V_{sub}$. In this way, whether or not any structural defect 6 exists within the gate oxide film 3, it is evaluated according to the existence or non-existence of leak current.

With such an evaluation method, it is impossible to identify the detailed positions of occurrence of structural defects 6. For example, in the case of a structural defect 6 existing in the gate oxide film 3 in the region sandwiched between the gate electrode 4 and the n+ impurity diffusion layer 2a, a leak current will flow, if there is a potential difference between voltage $V_g$ and voltage $V_d$. Although it is possible to verify that a structural defect 6 exists in the region sandwiched between the gate electrode 4 and the n+ impurity diffusion layer 2a, it is not possible to know in what specific part of the region the structural defect 6 exists. The same is true of cases in which the structural defect 6 exists in the gate oxide film 3 in the region sandwiched between the gate electrode 4 and the n+ impurity diffusion layer 2b, and in cases where the structural defect 6 exists in the gate oxide film 3 in the region sandwiched between the gate electrode 4 and the p-type Si substrate 1.

As explained above, with a conventional evaluation method for defects in semiconductor devices, there is a problem in that it is not possible to identify the positions of defects in the gate insulation film. Since this invention was developed in order to solve this problem, it thereby provides an evaluation method for determining the positions of defects in gate insulation film and also provides an evaluation method that can ascertain the size of the defective portion.

DISCLOSURE OF THE INVENTION

According to an aspect of the present invention, in an evaluation method for semiconductor devices, a part of a gate insulation film between a semiconductor substrate and an exposed gate electrode of a semiconductor device is partially and stepwise etched away. A voltage is applied between the semiconductor substrate and the gate electrode in a chemical wet etching system at each step. A position of a defect in the gate insulation film is detected from the difference in the area of the gate insulation film when an anode oxide film is formed on the gate electrode in a step, and when the gate electrode is etched away in another step.

In another aspect of the present invention, in the evaluation method for semiconductor devices, a part of the gate insulation film is covered by an anti-etching film.

In another aspect of the present invention, in the evaluation method for semiconductor devices, a KOH aqueous solution of substantially 0.25N raised to a temperature approximately at 60° C. is used as the chemical etching solution to perform the electrochemical wet etching.

According to another aspect of the present invention, in an evaluation method for semiconductor devices, a voltage is applied and varied, in a chemical wet etching system, between a semiconductor substrate and an exposed gate electrode of a semiconductor device, between which a gate insulation film is sandwiched. A size of a defect in the gate insulation film is detected by measuring the critical applied voltage between the applied voltage at which the exposed gate electrode is etched away and the applied voltage at which the exposed gate electrode is not etched away.

In another aspect of the present invention, in the evaluation method for semiconductor devices, a specified portion of the gate electrode is coated with an anti-etching film so as to make the exposed area small.

Other features and advantages of the present invention will become more apparent from the following description taken together with the accompanying drawings.

BEST MODE FOR CARRYING OUT THE INVENTION

This invention will be described in further detail by way of example with reference to the accompanying drawings.

The First Embodiment

A preferred embodiment of the present invention will hereinafter be described with reference to the drawings.

Figure 1:
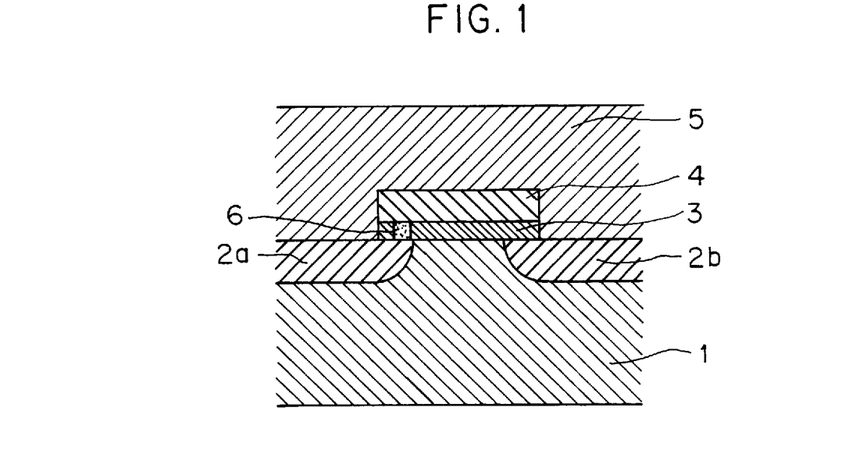
FIG. 1 shows a cross-sectional structure of a MOSFET as an example for evaluation in the present invention.

FIGS. 1 to 8 are drawings that explain an evaluation method for semiconductor devices according to the first embodiment. FIG. 1 shows a semiconductor device that will serve as the object of evaluation in this first preferred embodiment and in each of the preferred embodiments to be explained hereafter. FIG. 1 shows a cross-sectional structure of a MOSFET as an example. As shown in FIG. 1, the MOSFET comprises a p-type Si substrate 1, n+ impurity diffusion layers 2a and 2b, which serve as source and drain, a gate oxide film 3, a gate electrode 4, and an interlayer insulation film 5. A structural defect 6 exists in the gate oxide film 3.

Figure 2:
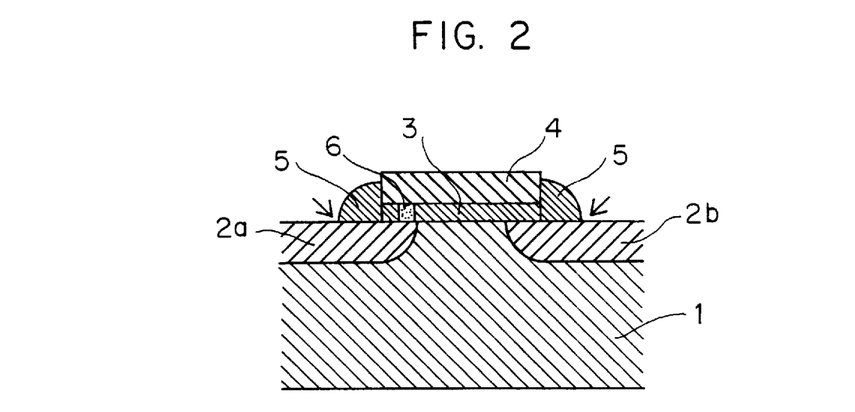
FIG. 2 shows a cross-sectional view of a semiconductor device which shows the process of evaluating a defective portion in the semiconductor device according to a first embodiment of the present invention.

The evaluation method for semiconductor devices of the present invention will be explained hereinafter. FIG. 2 and FIGS. 5 to 8 are cross-sectional views of a semiconductor device which show the process of evaluating a defective portion in the semiconductor device such as MOSFET as shown in FIG. 1. First, as shown in FIG. 2, the interlayer insulation film 5 is partially etched away from the semiconductor device, and the top surface and a part of the side surface of the gate electrode 4 are exposed. In cases where the interlayer insulation film 5 is a silicon oxide film, this processing can be carried out using an HF aqueous solution process. The edge positions of the interlayer insulation film 5 at this time (shown by the arrows in the figure) are ascertained.

Figure 3:
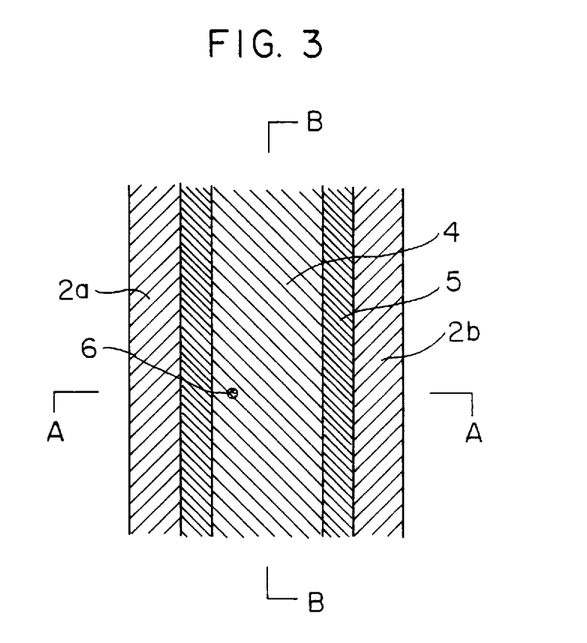
FIG. 3 is a plan view of the semiconductor device shown in FIG. 2.
Figure 4:
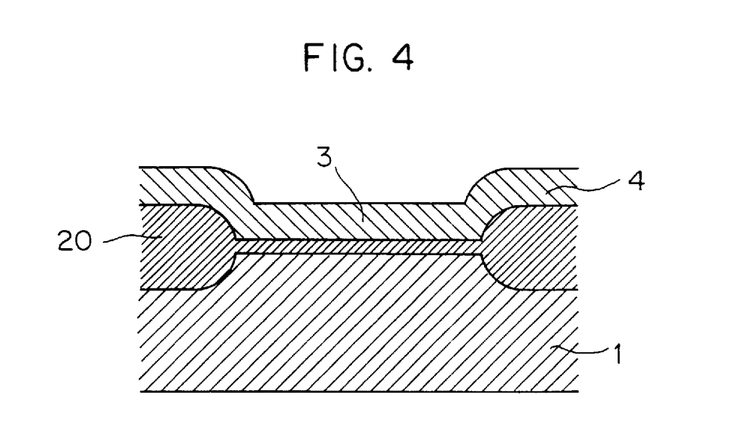
FIG. 4 is a sectional view taken along the line B—B of the plan view of FIG. 3.

FIG. 3 is a plan view of the semiconductor device shown in FIG. 2. The interlayer oxide film 5 remains along both sides of the belt-shaped gate electrode 4. The n+ impurity diffusion layers 2a and 2b can be seen on the outer sides. The structural defect 6 is positioned as a spot at the bottom of the gate electrode 4. FIG. 2 is, in return, a sectional view taken along the line A—A of the plan view shown in this FIG. 3. Furthermore, FIG. 4 is a sectional view taken along the line B—B of the plan view of FIG. 3 (a view compressed in the horizontal direction). The region of substrate 1 is subdivided by an isolation oxide film 20, the gate oxide film 3 is formed on an element formation region, and the gate electrode 4 runs along on the surface of the isolation oxide film 20.

Figure 5:
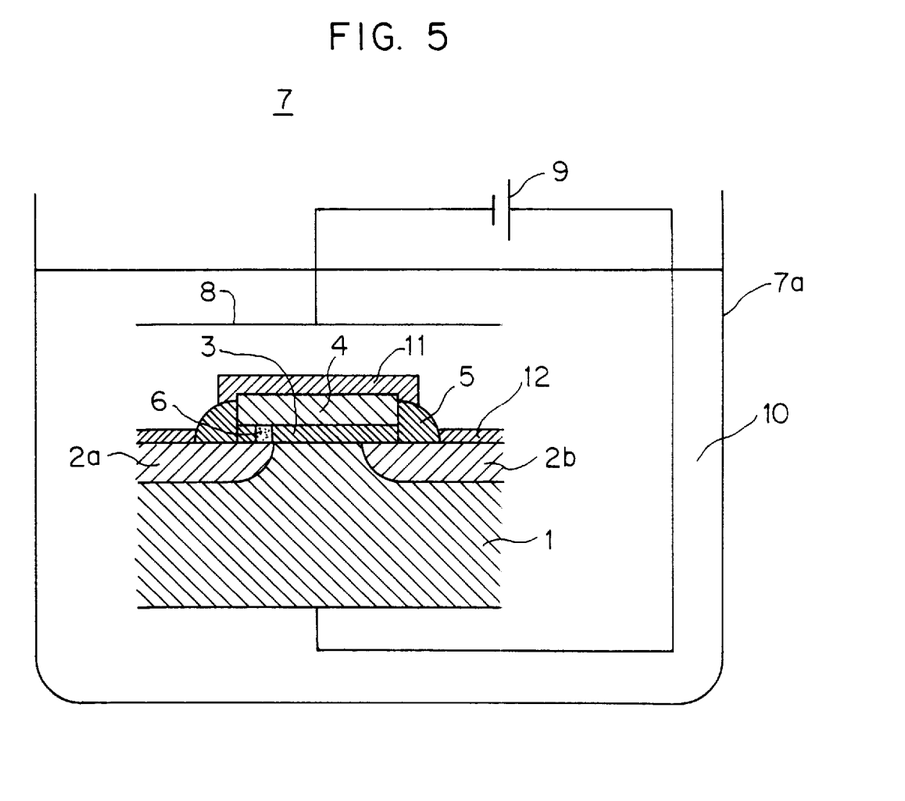
FIGS. 5–8 are cross-sectional views of a semiconductor device which show the process of evaluating a defective portion in the semiconductor device according to a first embodiment of the present invention.

FIG. 5 is a drawing showing the semiconductor device of FIG. 2 immersed in a wet etching system. In FIG. 5, the wet etching system 7 is provided with a chemical etching solution 10 that fills a solution tank 7a, a ground electrode 8 that is steeped in the etching solution 10, and a DC voltage source 9 that is connected to the ground electrode 8. The voltage application electrode on the other side of the DC voltage source 9 is connected to the p-Si substrate 1 of the semiconductor device, which is immersed in the solution tank 7a, and is used to apply a voltage.

Then, as shown in FIG. 5, the Si substrate 1 serves as the anode with respect to the ground electrode 8 in using the wet etching system 7, and chemical etching is performed. Chemical etching solutions typically used are KOH, NaOH, LiOH, CsOH, NH$_4$OH, ethylene diamine pyrocatechol, and hydrazine. A preferred example would be to use 5N KOH raised to a temperature of 60° C. as the chemical etching solution. By applying a DC voltage of several volts to several tens of volts to the Si substrate 1, the gate electrode 4 would reach about the same potential as the Si substrate 1 through the structural defect 6. At that time, anode oxide films 11 and 12 that function as passivation layers to halt the electrochemical etching would be formed on the surfaces of the gate electrode 4 and Si substrate 1. Therefore, the Si substrate 1 and gate electrode 4, on which the passivation layers 11 and 12 have been formed, would not be etched.

Figure 6:
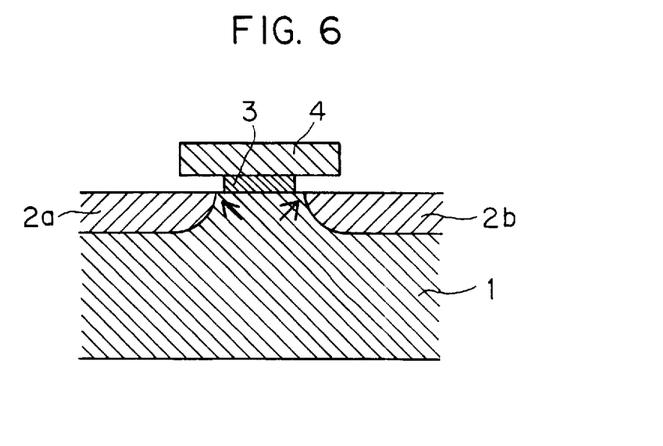

Next, as shown in FIG. 6, the interlayer insulation film 5 is etched from the MOSFET, and the part of the gate oxide film 3 that includes the structural defect 6 is also removed by the etching. When the insulation film 5 is a silicon oxide film, the processing may be performed by an HF aqueous solution process. The edge position of the gate oxide film 3 at this time is ascertained (shown in the figure using arrows).

Figure 7:
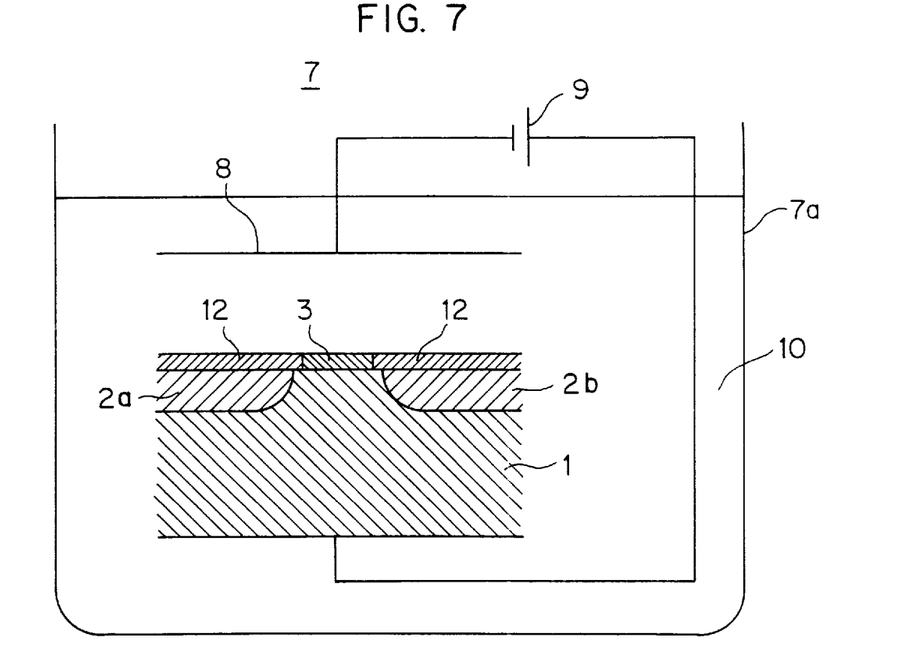

Next, as shown in FIG. 7, chemical etching is performed using the wet etching system 7 with the Si substrate 1 serving as the anode for the ground electrode 8. A preferred example of the chemical etching solution in this process would be to use 5N KOH heated to 60° C. When a DC voltage from several volts to several tens of volts is applied to the Si substrate 1, an anode oxide film 12 that functions as a passivation layer to halt the electrochemical etching is formed on the exposed surface of the Si substrate 1 and the surfaces of the impurity diffusion layers 2a and 2b. However, since the gate electrode 4 is electrically insulated from the Si substrate 1, no anode oxide film is formed on it and the gate electrode 4 is removed by the etching.

Figure 8:
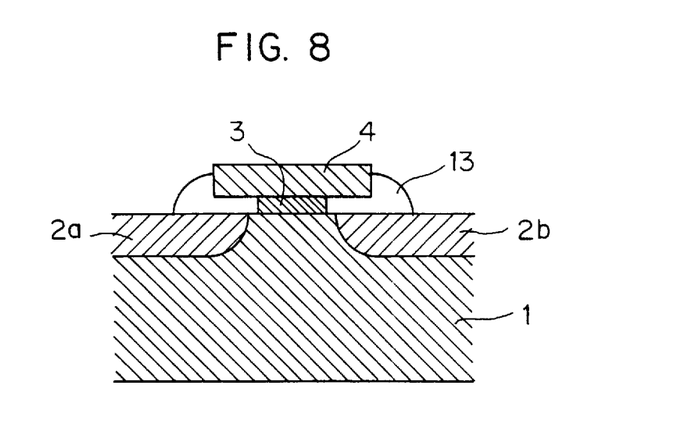

In this way, as shown in FIG. 8, the region 13 in which the structural defect 6 exists can be identified. This region is the difference between the interlayer insulation film 5 plus the gate oxide film 3 shown in FIG. 2 and the gate oxide film 3 in FIG. 6. In other words, this is the region additionally etched away by the etching from the gate oxide film 3 of FIG. 2. It is the difference in the breadth of the gate oxide film 3 between the two figures.

The Second Embodiment

Figure 9:
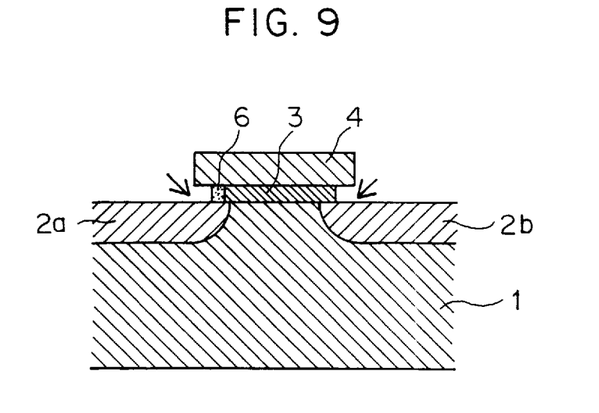
FIGS. 9–13 are cross-sectional views that show a process of an evaluation method for semiconductor devices of a second embodiment of the present invention.

Next, FIGS. 9 to 13 are cross-sectional drawings that show the process of an evaluation method for semiconductor devices of a second embodiment of the present invention. An explanation of the evaluation method for semiconductor devices in the second embodiment will be given with reference to FIGS. 9 to 13. First, as shown in FIG. 9, all of the interlayer insulation film 5 and part of the gate oxide film 3 are etched away from the semiconductor device as shown in FIG. 1, so that the top surface and both side surfaces of the gate electrode 4 are exposed. When the interlayer insulation film 5 is a silicon oxide film, the processing may be performed using an HF aqueous solution process. The edge position of the gate oxide film 3 at this time, shown with the arrows, is ascertained.

Figure 10:
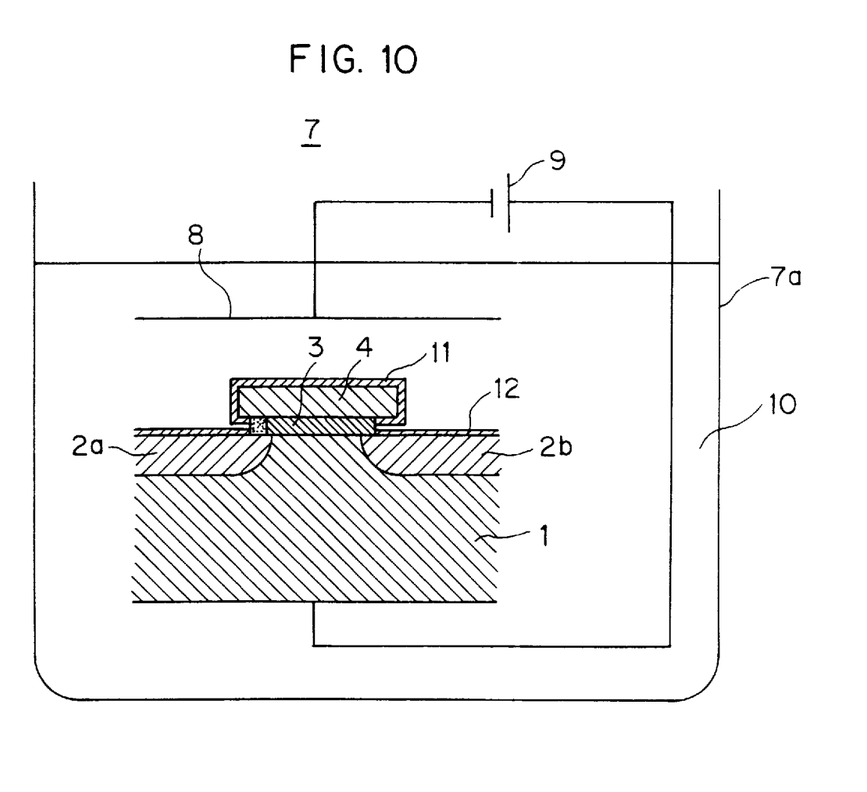

Next, chemical etching is performed using a wet etching system 7 with the Si substrate 1 serving as the anode for the ground electrode 8, as shown in FIG. 10. Typical chemical etching solutions used for this process are KOH, NaOH, LiOH, CsOH, NH$_4$OH, ethylene diamine pyrocatechol, and hydrazine. In the case of using 0.25N KOH raised to a temperature of 60° C. as the chemical etching solution, by applying a DC voltage of several volts to the Si substrate 1, the gate electrode 4 will reach about the same potential as the Si substrate 1 through the structural defect 6. Thin anode oxide films 11 and 12 of about 1 nm that function as passivation films to halt the electrochemical etching will be formed on the surface of the gate electrode 4 and the surfaces of the impurity diffusion layers 2a and 2b of the Si substrate 1. Consequently, the gate electrode 4 and the Si substrate 1, on which the anode oxide films 11 or 12 is formed, will not be etched.

Figure 11:
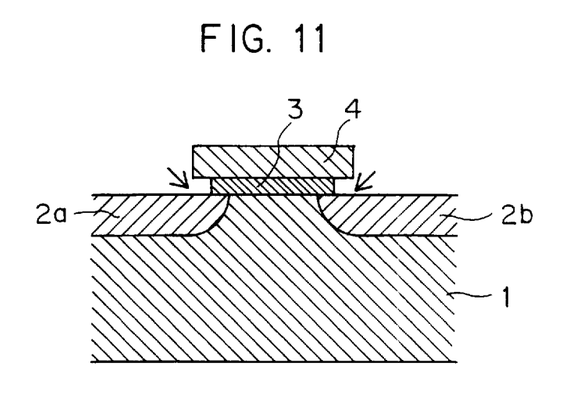

Next, the part of the gate oxide film 3 that includes the structural defect 6 is etched away using HF aqueous solution, as shown in FIG. 11. The edge position of the gate oxide film 3 at this time, shown by the arrows, is ascertained.

Figure 12:
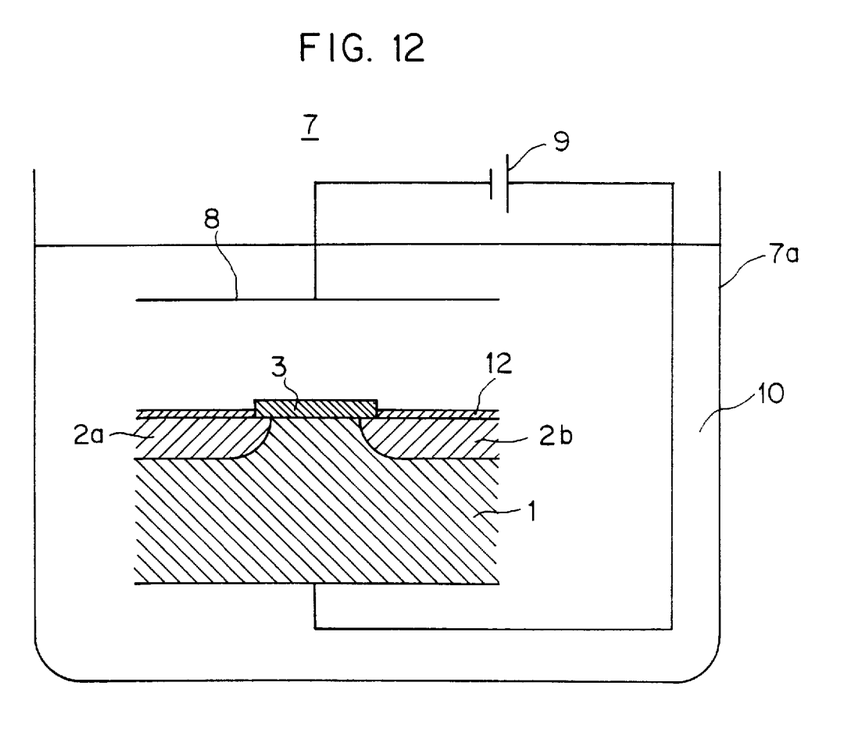

Next, chemical etching is performed using a wet etching system 7 with the Si substrate 1 serving as the anode for the ground electrode 8, as shown in FIG. 12. In the case of using 0.25N KOH raised to a temperature of 60° C. as the chemical etching solution, by applying a DC voltage of a few volts to the Si substrate 1, a thin anode oxide film 12 of about 1 nm is formed on the surfaces of the impurity diffusion layers 2a and 2b of the Si substrate 1. This anode oxide film 12 functions as a passivation film to halt the electrochemical etching. However, since the gate electrode 4 is electrically insulated from the Si substrate 1, no anode oxide layer is formed on it and the gate electrode 4 is etched.

Figure 13:
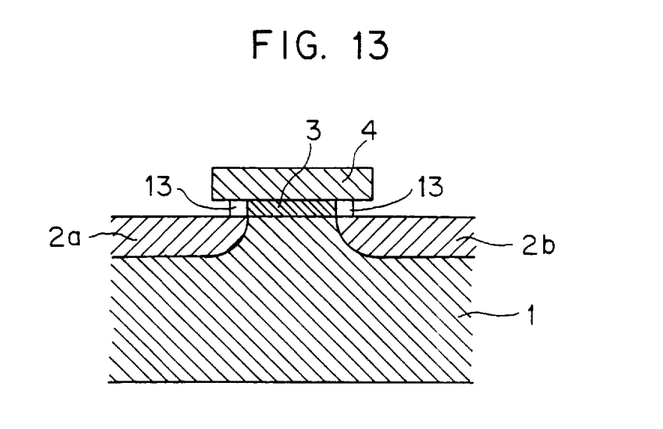

In this manner, as shown in FIG. 13, the region 13 where the structural defect 6 exists can be identified. The region 13 is the difference between the gate oxide film 3 in FIG. 9 and the gate oxide film 3 in FIG. 11.

In cases where the structural defect 6 is not etched away in the first embodiment by the etching of the gate oxide film 3 in the process of FIG. 6, as the next step, the process is shifted to the second embodiment. In the second embodiment, even when the structural defect 6 is not etched away by the etching of the gate oxide film 3 in FIG. 11, the gate oxide film 3 is further etched from the state of FIG. 11 until the structural defect 6 is etched away, with the etching of the gate oxide film 3 being continued in stages up until the region of its existence is clearly identified. In this manner, if the etching of the gate oxide film 3 is performed in small increments, the region where the structural defect 6 exists can be more specifically identified.

The Third Embodiment

Next, FIGS. 14 to 18 are cross-sectional drawings that show a process of an evaluation method for semiconductor devices according to a third embodiment of the present invention. The evaluation method for semiconductor devices of the third preferred embodiment will now be explained with reference to FIGS. 14 to 18. First, referring to FIG. 14, most part of the interlayer insulation film 5 is etched away from the same type of semiconductor device (MOSFET) as shown in FIG. 1. The side surfaces of the gate oxide film 3 is exposed, and the end positions of the interlayer insulation film 5 are ascertained, in the same way as in FIG. 2.

Figure 14:
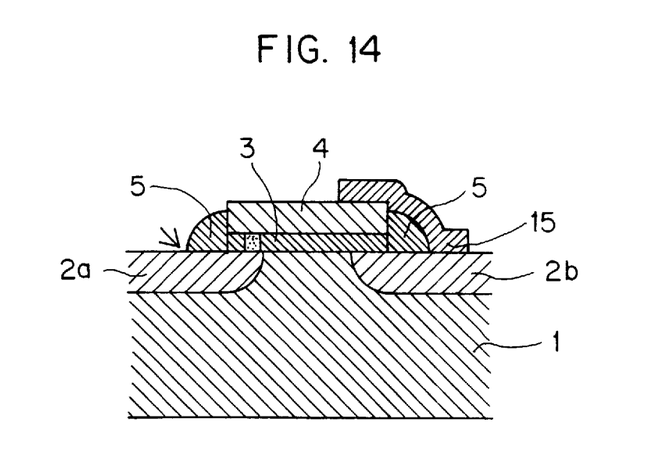
FIGS. 14–18 are cross-sectional views that show a process of an evaluation method for semiconductor devices according to a third embodiment of the present invention.

Next, an anti-etching film 15 is formed on a part of this semiconductor device to work against the chemical etching solution 10 as shown in FIG. 14. This anti-etching film 15 is formed so that it will extend over part of the n+ impurity diffusion layer 2b, the top of the interlayer insulation film 5 that contacts the n+ impurity diffusion layer 2b, and part of the top of the gate electrode 4. A carbonaceous coating formed by observation with an electron scanning microscope may be used as the anti-etching film 15.

Figure 15:
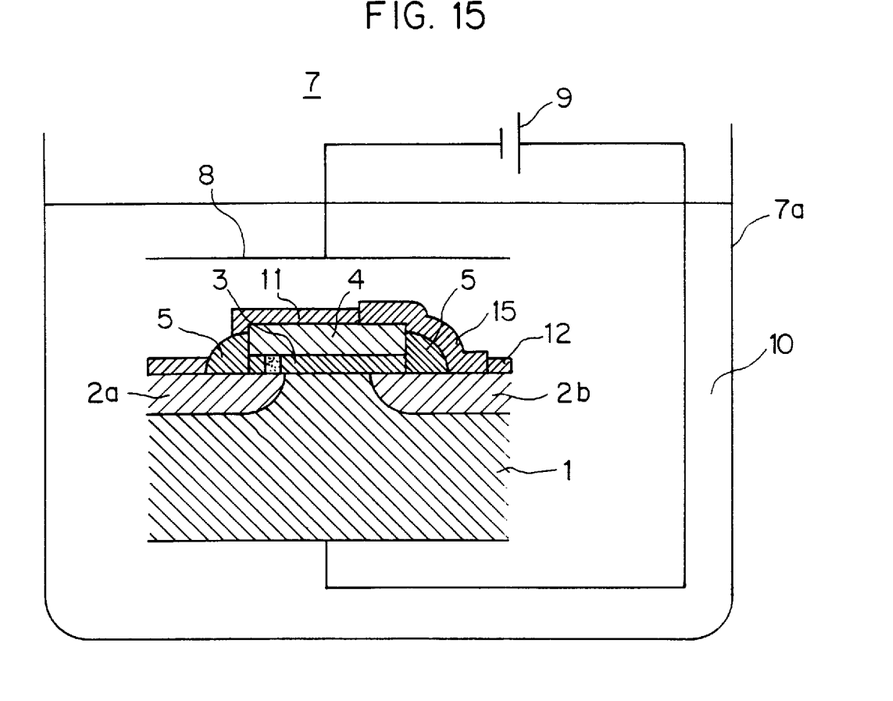

Next, chemical etching is performed using a wet etching system 7 with the Si substrate 1 serving as the anode for the ground electrode 8, as shown in FIG. 15. Typically in this process, chemical etching solutions are used such as KOH, NaOH, LiOH, CsOH, NH$_4$OH, ethylene diamine pyrocatechol, and hydrazine. A preferred example would be to use 5N KOH raised to a temperature of 60° C. as the chemical etching solution. By applying a DC voltage of several volts to several tens of volts to the Si substrate 1, the gate electrode 4 would reach about the same potential as the Si substrate 1 through the structural defect 6. Anode oxide films 11 and 12 that function as passivation films to halt the chemical etching would be formed on the surfaces of the gate electrode 4 and the Si substrate 1. Consequently, the Si substrate 1 and the gate electrode 4, on which the passivation films 11 and 12 have been formed, would not be etched.

Figure 16:
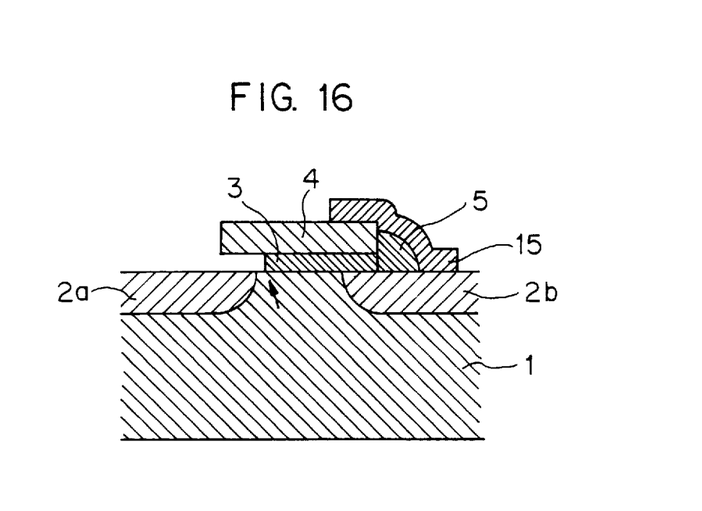

Next, as shown in FIG. 16, part of the interlayer insulation film 5 and the part of the gate oxide film 3 that includes the structural defect 6 would be etched away. In cases where the interlayer insulation film 5 is a silicon oxide film, the processing can be performed using an HF aqueous solution process. The edge position of the gate oxide film 3 at that time would be ascertained (as indicated by the arrows).

Figure 17:
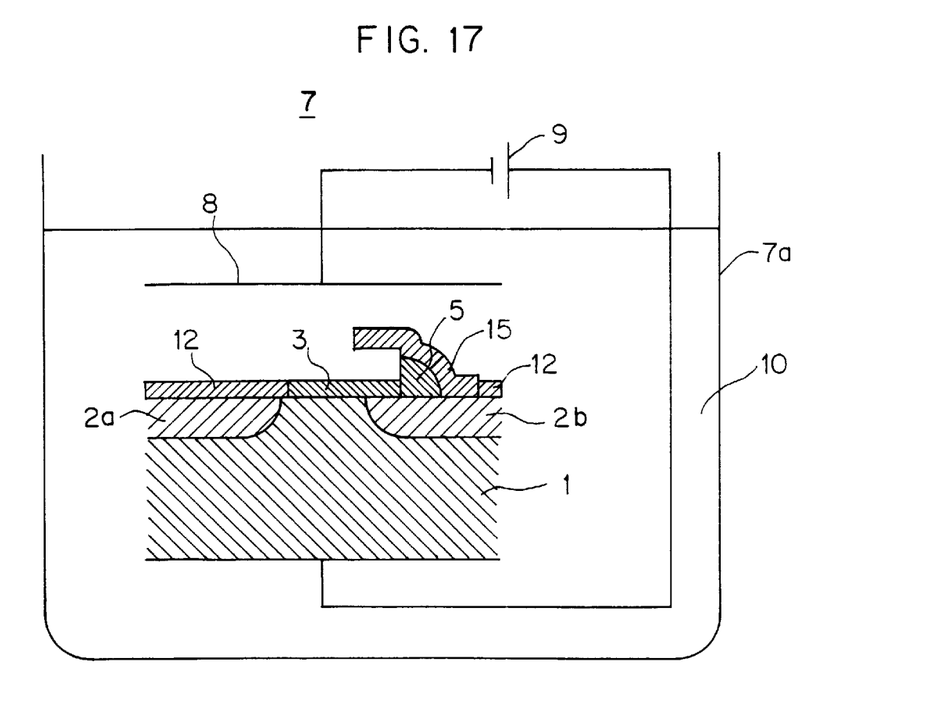

Next, chemical etching is performed using a wet etching system 7 with the Si substrate 1 serving as the anode for a ground electrode 8, as shown in FIG. 17. A preferred example would be to use 5N KOH raised to a temperature of 60° C. as the chemical etching solution. By applying a DC voltage of several volts to several tens of volts to the Si substrate 1, an anode oxide film 12 that functions as a passivation film to halt the electrochemical etching is formed on the surfaces of the Si substrate 1 and the impurity diffusion layers 2a and 2b. Since the gate electrode 4 is electrically insulated from the Si substrate 1, an anode oxide film is not formed on it and the gate electrode 4 is etched away.

Figure 18:
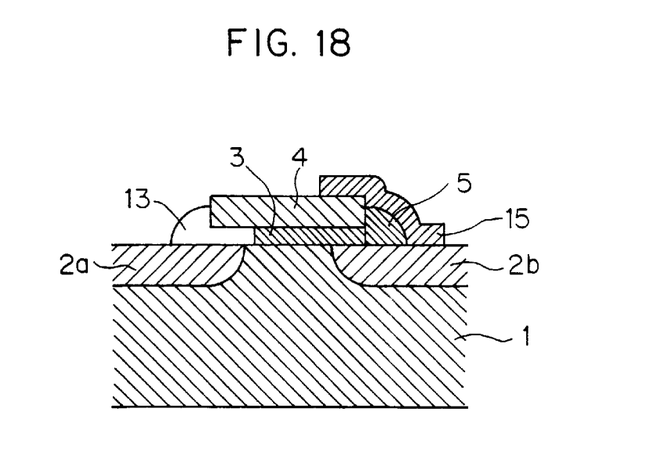

In this manner, as shown in FIG. 18, the region 13 where the structural defect 6 exists can be identified. The region 13 is the difference between the interlayer insulation film 5 plus the gate oxide film 3 of FIG. 14 and the interlayer insulation film 5 plus the gate oxide film 3 in FIG. 16. In other words, this is the region where the gate oxide film 3 has been additionally etched from the gate oxide film 3 of FIG. 14.

The Fourth Embodiment

Figure 19:
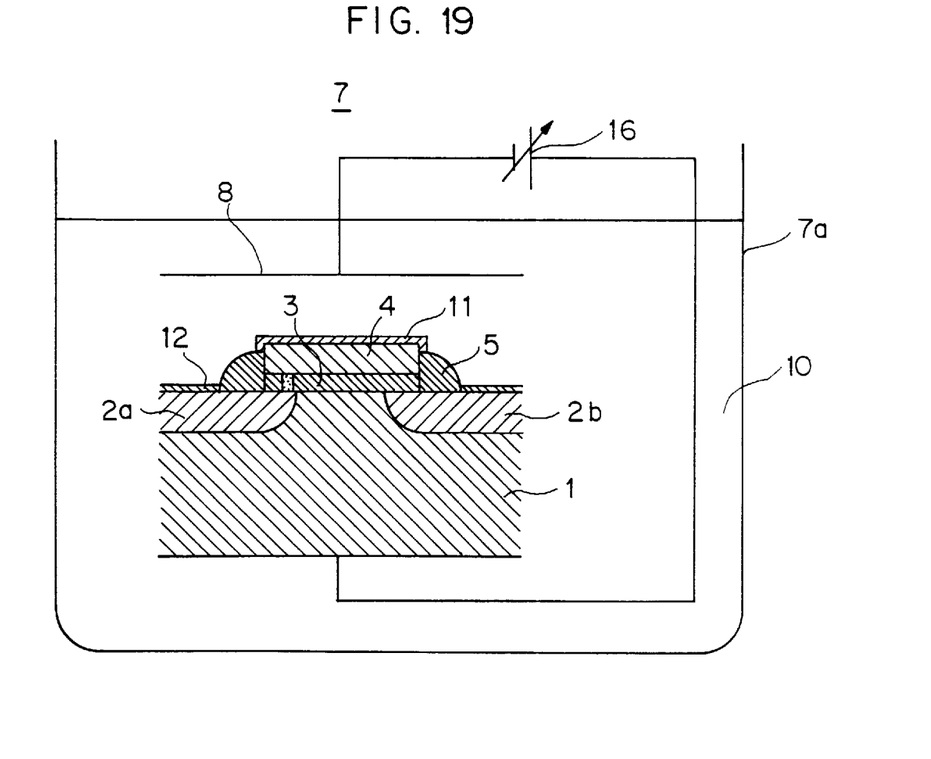
FIG. 19 is a cross-sectional view that shows a process of an evaluation method for semiconductor devices according to a fourth embodiment of the present invention.
Figure 20:
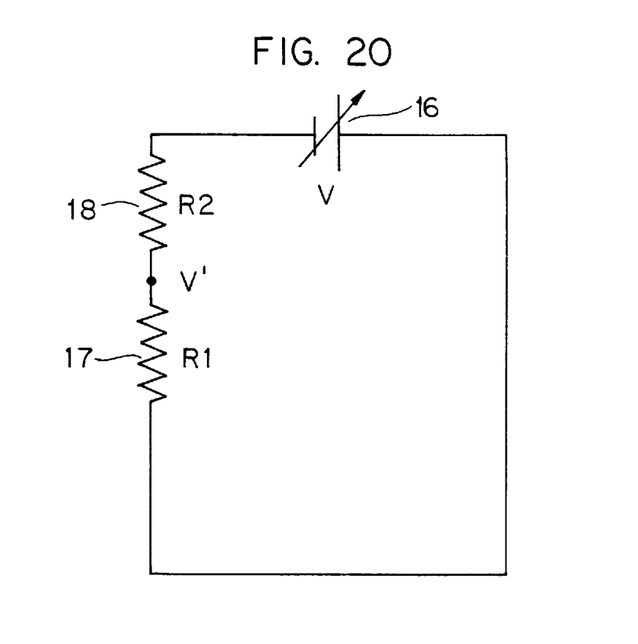
FIG. 20 is an equivalent circuit of the electrical circuit shown in FIG. 19.

FIGS. 19 and 20 are drawings for explaining an evaluation method for semiconductor devices according to a fourth embodiment of the present invention. FIG. 19 is a cross-sectional view in which a semiconductor device that is the object of evaluation is immersed in a wet etching system. FIG. 20 is an equivalent circuit drawing of the electrical circuit for the state shown in FIG. 19.

First, part of the interlayer insulation film 5 is etched away from a semiconductor device as shown if FIG. 1, so that the top surface and part of the side surfaces of the gate electrode 4 are exposed, as shown in FIG. 2. In cases where the interlayer insulation film 5 is a silicon oxide film, the processing can be performed by an HF aqueous solution process. FIG. 19 is a drawing that indicates a state in which such a semiconductor device is immersed in a wet etching system 7. In FIG. 19, the wet etching system 7 is provided with a chemical etching solution 10 that fills up a solution tank 7a, a ground electrode 8 that is steeped in this etching solution 10, and a DC variable voltage source 16 that is connected to the ground electrode 8. The voltage electrode on the other side of the DC variable voltage source 16 is connected to the p-Si substrate 1 of the semiconductor device, which is immersed in the solution tank 7a, and voltage is applied to it.

FIG. 20 is an equivalent circuit for the configuration of FIG. 19. This equivalent circuit is a series circuit of the DC variable voltage source 16, an equivalent resistance 17, and an equivalent resistance 18. Here, equivalent resistance 17 is the resistance that electrically expresses the structural defect 6 within the equivalent circuit 17. Equivalent resistance 18 is the resistance that electrically expresses the anode oxide film formed on the gate electrode 4 within the equivalent circuit.

As shown in FIG. 19, chemical etching is performed using the wet etching system 7 with the Si substrate 1 serving as the anode for the ground electrode 8. Representative chemical etching solutions for the process are KOH, NaOH, LiOH, CsOH, NH$_4$OH, ethylene diamine pyrocatechol, and hydrazine. In cases where the chemical etching solution is 5N KOH raised to a temperature of 60° C., by applying a DC voltage V to the Si substrate 1, the gate electrode 4 is raised to potential V' through the structural defect 6. If the DC voltage V applied to the Si substrate 1 is sufficiently high, anode oxide films 11 and 12 that function as passivation layers to halt the electrochemical etching will be formed on the surfaces of the gate electrode 4 and the Si substrate 1. Consequently, the Si substrate 1, including the impurity diffusion layers 2a and 2b, and the gate electrode 4, on which the passivation layers 11 and 12 have been formed, will not be etched. However, if the DC voltage V applied to the Si substrate 1 is too low, an anode oxide film that functions as a passivation layer to halt the electrochemical etching will not be formed on the surface of the gate electrode 4, and the gate electrode 4 will be etched. The critical voltage VTH for these two conditions is found. In finding the critical voltage VTH, one may start from a sufficiently high DC voltage and gradually lower the voltage until the critical voltage value VTH is found at which the etching of the gate electrode begins.

The relations shown in FIG. 20 between the critical voltage VTH, the voltage V'TH of the gate electrode at that time (the passivation voltage), the resistance value R1 of resistance 17, which electrically expresses the structural defect within the circuit, and the resistance value R2 of resistance 18, which electrically expresses the anode oxide film formed on the gate electrode 4 within the circuit, may be approximated as follows.

$$(VTH-V'TH) \times R2 = V'TH \times R1 \qquad \text{(Equation 1)}$$

If the gate electrode material and chemical etching conditions are known, it is possible to find the passivation voltage V'TH for the gate electrode and the resistance value R2 of the anode oxide film 11 through preliminary experimentation. For example, if the gate electrode material is polycrystal Si including 7E2O atoms/cm$^3$ of phosphorus as an impurity, and the chemical etching solution is 5N KOH aqueous solution raised to a temperature of 6° C., the passivation voltage V'TH will be about 0.5V and resistance value R2 will be several KΩ/cm$^2$. If the area S of the gate electrode 4 is known, resistance value R2 of the anode oxide film 11 can be determined. Therefore, if critical voltage VTH can be found experimentally, by transforming Equation 1, the resistance value R1 of the structural defect 6 can be determined as follows.

$$R1 = [(VTH-V'TH)/V'TH] \times R2 \qquad \text{(Equation 2)}$$

In this manner, the equivalent resistance of the structural defect can be found and the amount of leak current can be determined simply by using a direct current variable voltage source 16 to experimentally determine the critical voltage VTH which is the boundary of the cases in which an anode oxide film is formed on the gate electrode 4 and it is not etched away, or in which an anode oxide film is not formed and it is etched away. In this way, the size of a structural defect in the gate oxide film is determined.

The Fifth Embodiment

Figure 21:
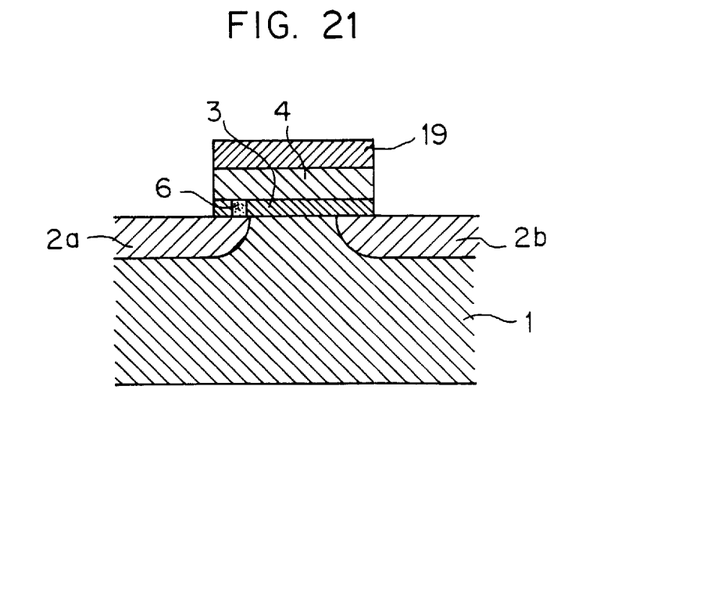
FIGS. 21 and 22 are cross-sectional views that show an evaluation method for semiconductor devices according to a fifth embodiment of the present invention.
Figure 22:
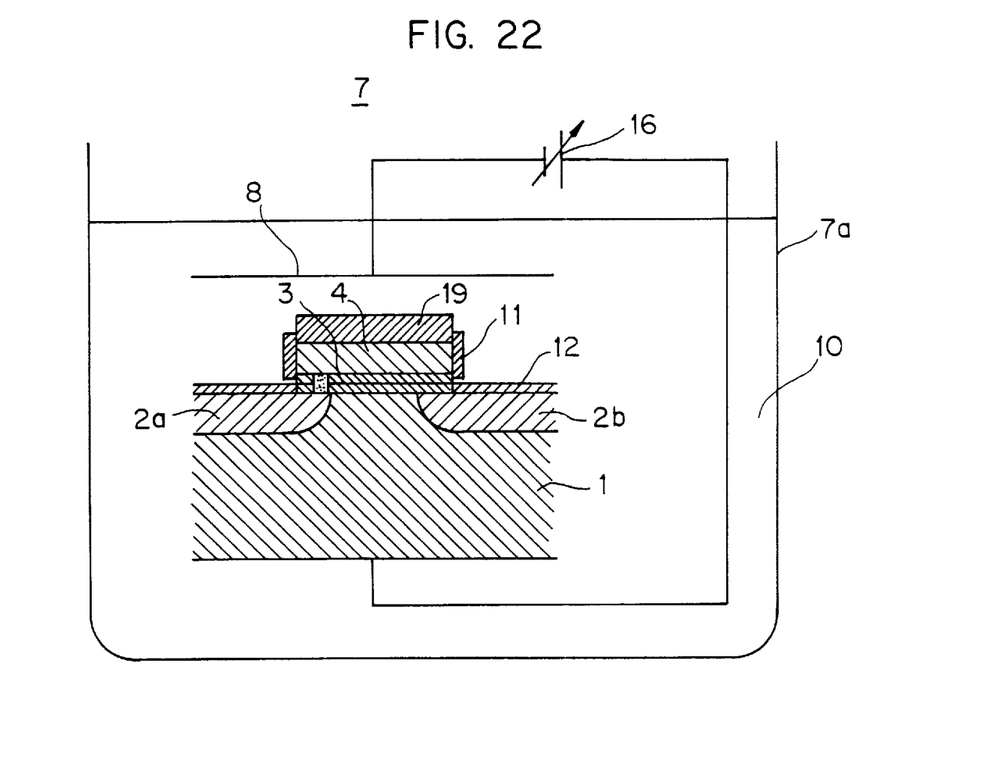

FIGS. 21 and 22 are cross-sectional views that show an evaluation method for semiconductor devices according to a fifth embodiment of the present invention. First, part of the interlayer insulation film 5 is etched away from a semiconductor device similar to that of FIG. 1, so that an insulation film 19 remains on the top surface of the gate electrode 4 as shown in FIG. 21, and both side surfaces of the gate electrode 4 are exposed. In the case where the interlayer insulation film 5 is a silicon oxide film, and the insulation film 19 is a silicon nitride film, the processing may be performed by an HF aqueous solution process.

Next, as shown in FIG. 22, this semiconductor device is immersed in a wet etching system 7 and chemical etching is performed with the Si substrate 1 serving as the anode for the ground electrode 8. Chemical etching solutions typically used for this process are KOH, NaOH, LiOH, CsOH, NH$_4$OH, ethylene diamine pyrocatechol, and hydrazine. In the case where 5N KOH raised to a temperature of 6° C. is used as the chemical etching solution, by applying a DC voltage V to the Si substrate 1, the gate electrode 4 will be raised to a potential of V' through the structural defect 6. If the DC voltage V applied to the Si substrate 1 is sufficiently high, anode oxide films 11 and 12 that function as passivation layers to halt the electrochemical etching will be formed on the surfaces of the gate electrode 4 and the Si substrate 1 including the impurity diffusion layers 2a and 2b. Consequently, the gate electrode 4 and the Si substrate 1 including the impurity diffusion layers 2a and 2b, on which the passivation layers 11 and 12 have been formed, will not be etched.

If the DC voltage V applied to the Si substrate 1 is too low, an anode oxide film 11 that functions as a passivation layer to halt the electrochemical etching will not be formed on the surface of the gate electrode 4, and the gate electrode 4 will be etched away. The critical voltage VTH for these two conditions are to be found. In finding the critical voltage VTH, one may start from a sufficiently high DC voltage and gradually lower the voltage until the critical voltage value VTH is found at which the etching of the gate electrode 4 begins. The resistance value R1 of the structural defect 6 is determined using Equation 2.

With this fifth embodiment, it is possible to form an extremely small area where the gate electrode 4 is exposed, since an insulation layer 19 has been formed on the gate electrode 4 of the semiconductor device. Therefore, it is possible to make the resistance value R2 of the anode oxide film 11 large. Consequently, it is possible to perform evaluation even in cases where a large value is taken for the resistance value R1 of the structural defect 6, that is, where the structural defect is minute.

In this manner, by having a resistance layer 19 remain on the gate electrode 4 and forming an anode oxide film 12 with the function of a passivation layer only on the two surface sides of the gate electrode 4, it is possible to evaluate a structural defect 6 with a higher resistance value.

As stated in the above, with the evaluation method for semiconductor devices according to the present invention, it is possible to identify the position of a structural defect that exists in a gate oxide film. Furthermore, it is possible to detect the size of a structural defect that exists in a gate oxide film.

Obviously, numerous additional modifications and variations of the present invention are possible in light of the above teachings. It is therefore to be understood that within the scope of the appended claims, the present invention may be practiced otherwise than as specifically described herein.

We claim:

1. An evaluation method for semiconductor devices comprising the steps of:

partially and stepwise etching away a part of a gate insulation film between a semiconductor substrate and an exposed gate electrode of a semiconductor device;

applying a voltage between said semiconductor substrate and the gate electrode in a chemical wet etching system at each step; and detecting a position of a defect in said gate insulation film from the difference in the area of the gate insulation film when an anode oxide film is formed on said gate electrode and when said gate electrode is etched away.

2. An evaluation method for semiconductor devices according to claim 1, wherein a part of said gate insulation film is covered by an anti-etching film.

3. An evaluation method for semiconductor devices according to claim 1, wherein a KOH aqueous solution of substantially 0.25N raised to a temperature approximately at 60° C. is used as the chemical etching solution to perform said electrochemical wet etching.

4. An evaluation method for semiconductor devices comprising the steps of:

varying, in a chemical wet etching system, an applied voltage between a semiconductor substrate and an exposed gate electrode of a semiconductor device, between which a gate insulation film is sandwiched; and detecting a size of a defect in said gate insulation film by measuring the critical applied voltage between the applied voltage at which the exposed gate electrode is etched away and the applied voltage at which the exposed gate electrode is not etched away.

5. An evaluation method for semiconductor devices according to claim 4, wherein a specified portion of said gate electrode is coated with an anti-etching film so as to make the exposed area small.

* * * * *